United States Patent [19]
Yang

[11] Patent Number: 5,508,547
[45] Date of Patent: *Apr. 16, 1996

[54] LDMOS TRANSISTOR WITH REDUCED PROJECTIVE AREA OF SOURCE REGION

[75] Inventor: Sheng-Hsing Yang, Hsinchu, Taiwan

[73] Assignee: United Microelectronics Corp., Hsinchu, Taiwan

[*] Notice: The term of this patent shall not extend beyond the expiration date of Pat. No. 5,451,805.

[21] Appl. No.: 324,802

[22] Filed: Oct. 18, 1994

Related U.S. Application Data

[62] Division of Ser. No. 223,985, Apr. 6, 1994, Pat. No. 5,466,616.

[51] Int. Cl.[6] ............ H01L 29/76; H01L 29/94; H01L 31/062; H01L 31/113

[52] U.S. Cl. .......... 257/343; 257/339; 257/341; 257/342

[58] Field of Search ............ 257/329, 339, 257/341, 342, 343; 29/571

[56] References Cited

U.S. PATENT DOCUMENTS

| | | | |
|---|---|---|---|
| 4,561,168 | 12/1985 | Pitzer et al. | 29/571 |
| 4,682,405 | 7/1987 | Blanchard et al. | 29/571 |

*Primary Examiner*—Steven H. Loke
*Attorney, Agent, or Firm*—Ladas & Parry

[57] ABSTRACT

Reduced-size LDMOS transistor having reduced leakage and a reduced propensity to latch-up. The LDMOS transistor has a trench with vertical sidewalls adjacent to a source region to help reduce a vertical projective area of the source region.

3 Claims, 9 Drawing Sheets

LDMOS TRANSISTOR WITH REDUCED PROJECTIVE AREA OF SOURCE REGION

This is a divisional of application Ser. No. 08/223,985 filed Apr. 6, 1994, now U.S. Pat. No. 5,466,616.

FIELD OF THE INVENTION

The present invention relates to a method of producing an LDMOS (Laterally Diffused Metal Oxide Semiconductor) transistor, especially to a method of producing an LDMOS transistor having reduced dimensions, reduced leakage, and a reduced propensity to latch-up.

BACKGROUND OF THE INVENTION

Figure 1:
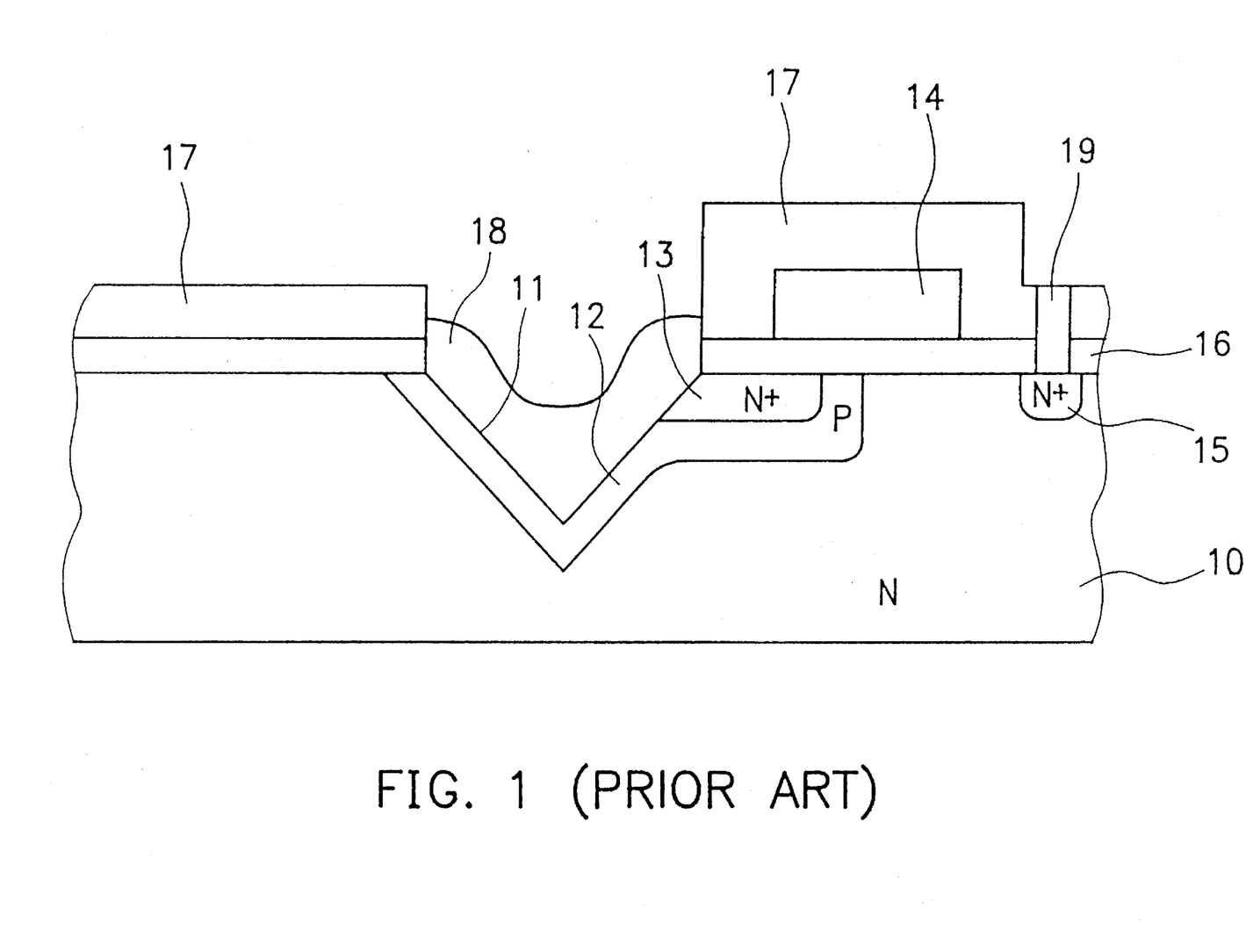
FIG. 1 shows a cross-sectional view of the structure of an LDMOS transistor disclosed in U.S. Pat. No. 4,682,405.

A cross-sectional view of the structure of an LDMOS transistor disclosed in U.S. Pat. No. 4,682,405 is shown in FIG. 1. The LDMOS transistor has an N type substrate 10, a V-shaped trench 11, a P type body region 12, an N+ source region 13, a gate electrode 14, an N+ drain region 15, gate oxide 16, an oxide layer 17, a source electrode metal contact 18, and a drain electrode metal contact 19. In this structure, the V-shape trench 11 is used to reduce the dimension of the entire LDMOS transistor. However, since the N+ source region 13, the P type body region 12, and the N type substrate 10 form a vertical parasitic NPN transistor, and the vertically projected area of the N+ source region 13 is relatively large, the leakage caused by the parasitic NPN transistor is relatively large and its propensity to cause latch-up problems is a drawback.

SUMMARY OF THE INVENTION

The object of the present invention is to provide a method of producing an LDMOS transistor which has reduced dimensions, reduced leakage, and a reduced propensity to latch-up.

The above objects are fulfilled by providing a method of producing an LDMOS transistor on a substrate of a first conductivity type. The method comprises the following steps: (a) forming field oxides on said first conductivity type epitaxial layer to define an active region of said LDMOS transistor, and floating region insulator on an floating region of the active region; (b) forming a gate electrode of said LDMOS transistor at a predetermined position of the active region near the floating region insulator; (c) implanting and diffusing impurities of the first conductivity type into said first type substrate to form a first region of the first conductivity type and a second region of the first conductivity type, the first region of the first conductivity type forming a drain region of said LDMOS transistor; (d) forming a first trench on the second region of the first type to reach the first conductivity type substrate using the field oxides and the gate electrode as a mask; residual portions of the second region of the first conductivity type forming a source region of said LDMOS transistor; (e) forming a second trench on the first trench, the second trench having at least two planes; (f) implanting and diffusing impurities of a second conductivity type into the second trench to form a body region of the second type, the body region of the second type enclosing the source region; and (g) metalizing said substrate.

BRIEF DESCRIPTION OF THE DRAWING

The present invention be more fully understood from the following detailed description when read with reference to the accompanying drawings, which are illustrative of preferred embodiments of the invention only, and thus are not limitative of the present invention and wherein.

DETAILED DESCRIPTION OF THE PREFERRED EMBODIMENTS

One of the preferred embodiments of the present invention is shown in FIGS. 2a to 2g. In this embodiment, an N substrate 20 is used to form an LDMOS transistor. In the second embodiment, an P substrate 20 is used to form an LDMOS transistors, which is made in a similar process with appropriate conductivity type changes to the various regions which are implanted. The processing of the N substrate is described in detail below, while the processing of the P substrate will be readily apparent to those skilled in the art from the detailed description given for the N substrate.

STEP 1

Figure 2A:
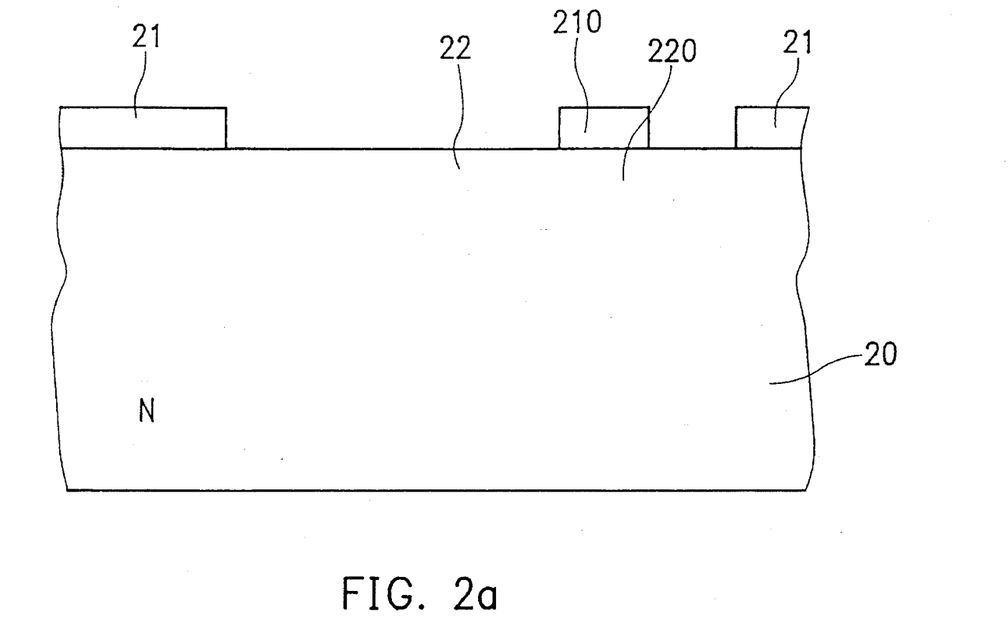
FIGS. 2a to 2g show an embodiment of producing an LDMOS transistor according to the method of the present invention.

Field oxides 21 are formed on the N type substrate 20 to define an active region 22 of the LDMOS transistor, and a floating region insulator 210 is formed on the floating region 220 in the active region 22 by, for example, forming an oxide layer by thermal oxidization, then etching the oxide layer by conventional lithography techniques; or, forming a pad oxide and a silicon nitride layer, then etching using conventional lithography techniques, to form the field oxides 21 and the floating region insulator 210 as shown in FIG. 2a.

STEP 2

Figure 2B:
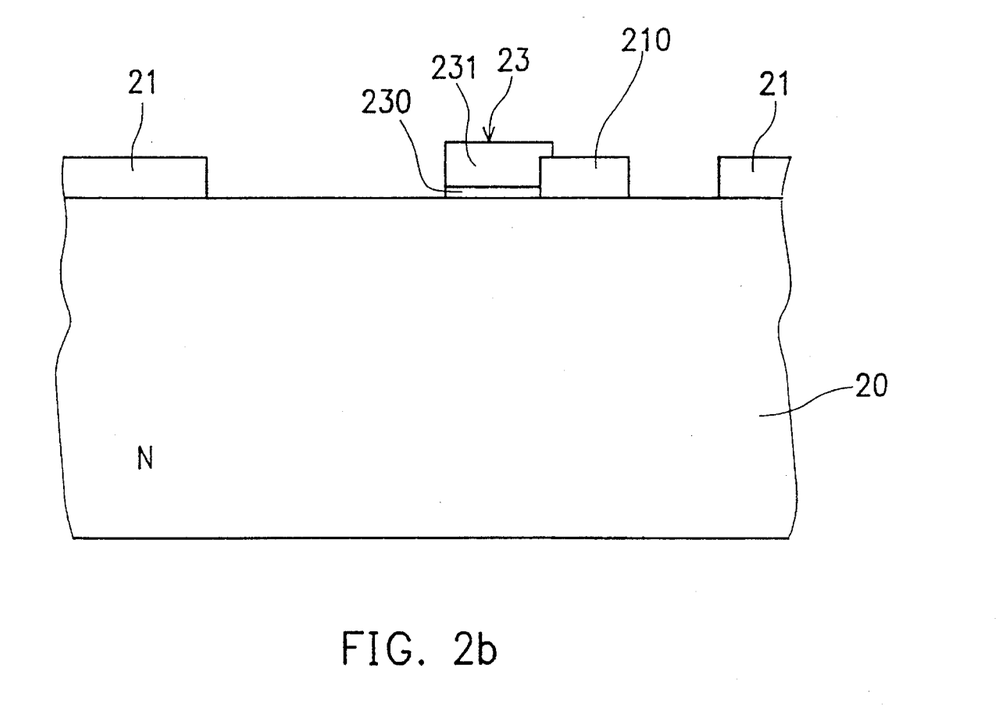

As shown in FIG. 2b, a gate electrode 23 is formed on a predetermined region of the active region 22 near the floating region insulator 210. This can be done by, for example, forming gate oxide 230, depositing a polysilicon layer 231 on the gate oxide 230, and etching the gate oxide 230 and the polysilicon layer 231 using conventional lithography techniques.

STEP 3

Figure 2C:
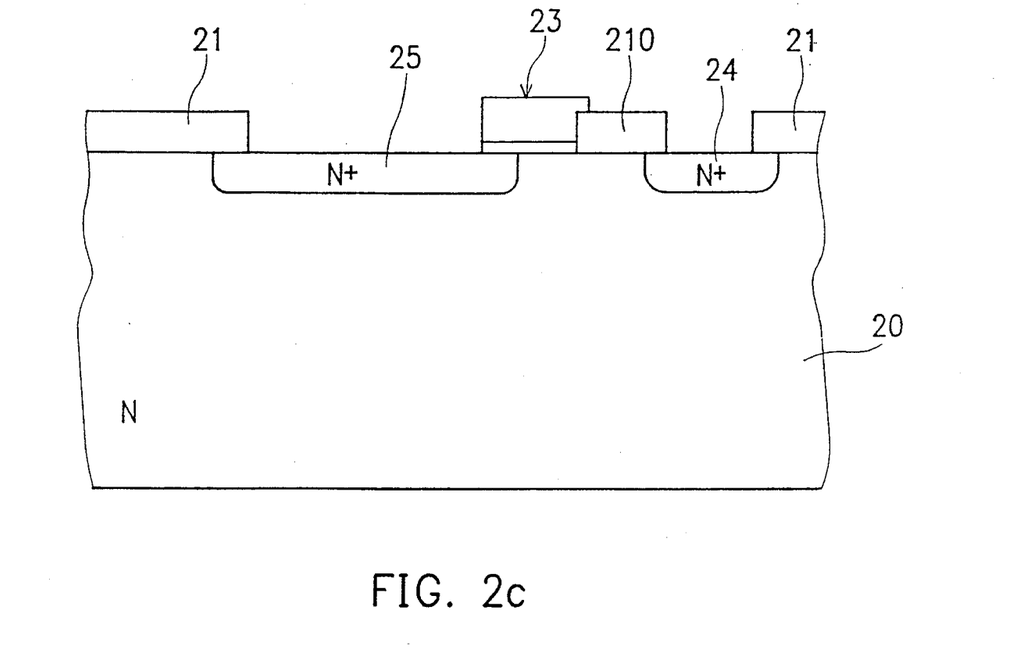

As shown in FIG. 2c, N type impurities are implanted into the N type substrate 20 and diffused, to form a first N+ region 24 and a second N+ region 25. This can be done using conventional implantation and diffusion techniques. The first N+ region 24 will form a drain region of the LDMOS transistor.

STEP 4

Figure 2D:
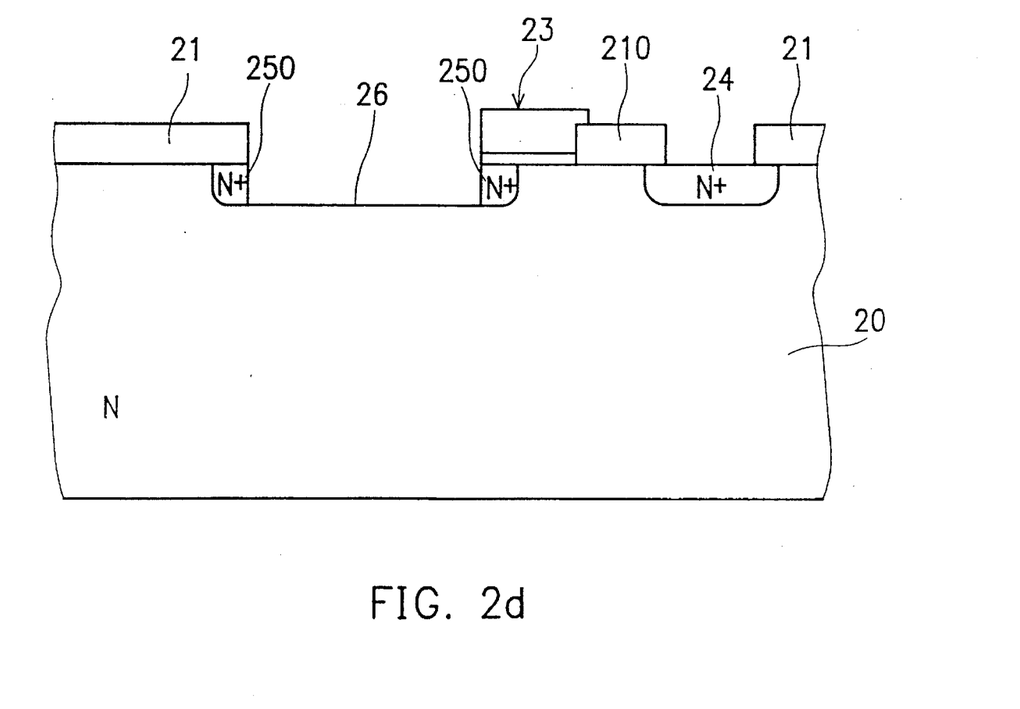

Turning to FIG. 2d, a first trench 26 is formed in the second N+ region 25. The boundaries of the first trench 26 are the same as that of the field oxide 21 and the gate electrode 23. The bottom of the first trench 26 extends to the bottom of N+ region 25 in the N type substrate 20. Residual portions of the second N+ region 25 underlie a portion of the field oxide 25 and the gate electrode 23 and form a source region 250 of the LDMOS transistor. The etching can be done by conventional anisotropic etching techniques, e. g. Reactive Ion Etching (RIE).

STEP 5

Figure 2E:
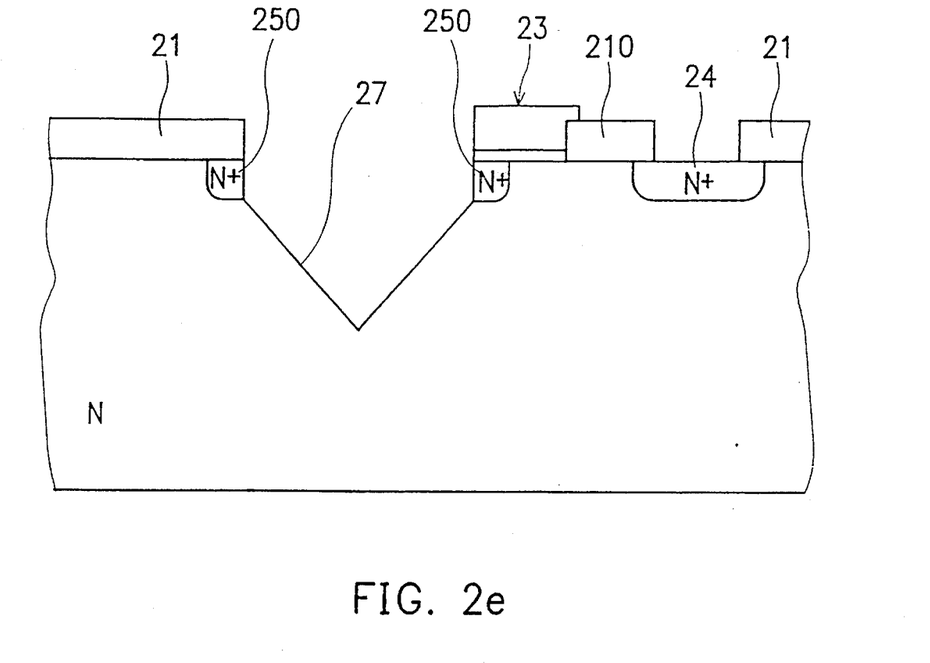

An additional trench 27 is formed on the first-mentioned trench 26, as can be seen in FIG. 2e. The second-mentioned trench 27 consists of at least two side walls. The shape of the second-mentioned trench 27 is preferably V-shaped as shown in FIG. 2e, but other shapes may be utilized, if desired. If the second-mentioned trench 27 is V-shaped, this step can be done by conventional anisotropic etching techniques, e. g. etching the second-mentioned trench 27 by using an etchant provided by a solution containing KOH and isopropyl alcohol. Also, those skilled in the art will appreciate that the silicon substrate 20 should have a (100)-plane at its top surface because KOH solutions preferentially etch the (100)-plane over the (111)-plane. The (111)-plane resists the etch and thus the side walls of the trench 26 are defined by (111)-planes.

STEP 6

Figure 2F:
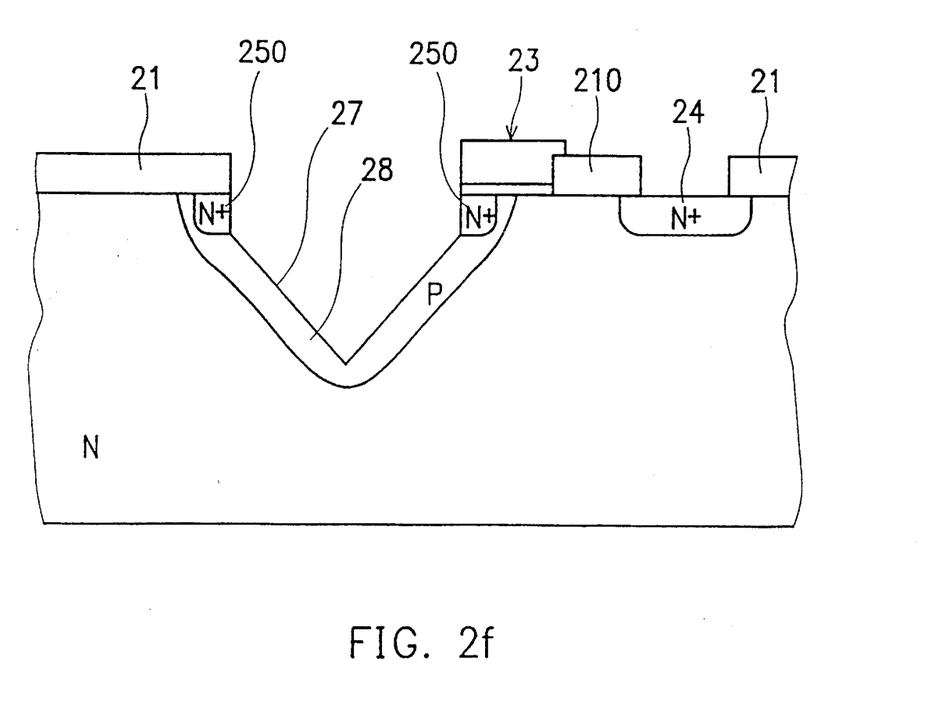

Next, as shown in FIG. 2f, P type impurities are implanted into the second-mentioned trench 27 and diffused to form a P type body region 28. This can be done using conventional implantation and diffusion techniques. It should be noted that the dosage of the P type impurities must not be so high as to change the conductivity type of N+ source region 250.

STEP 7

Figure 2G:
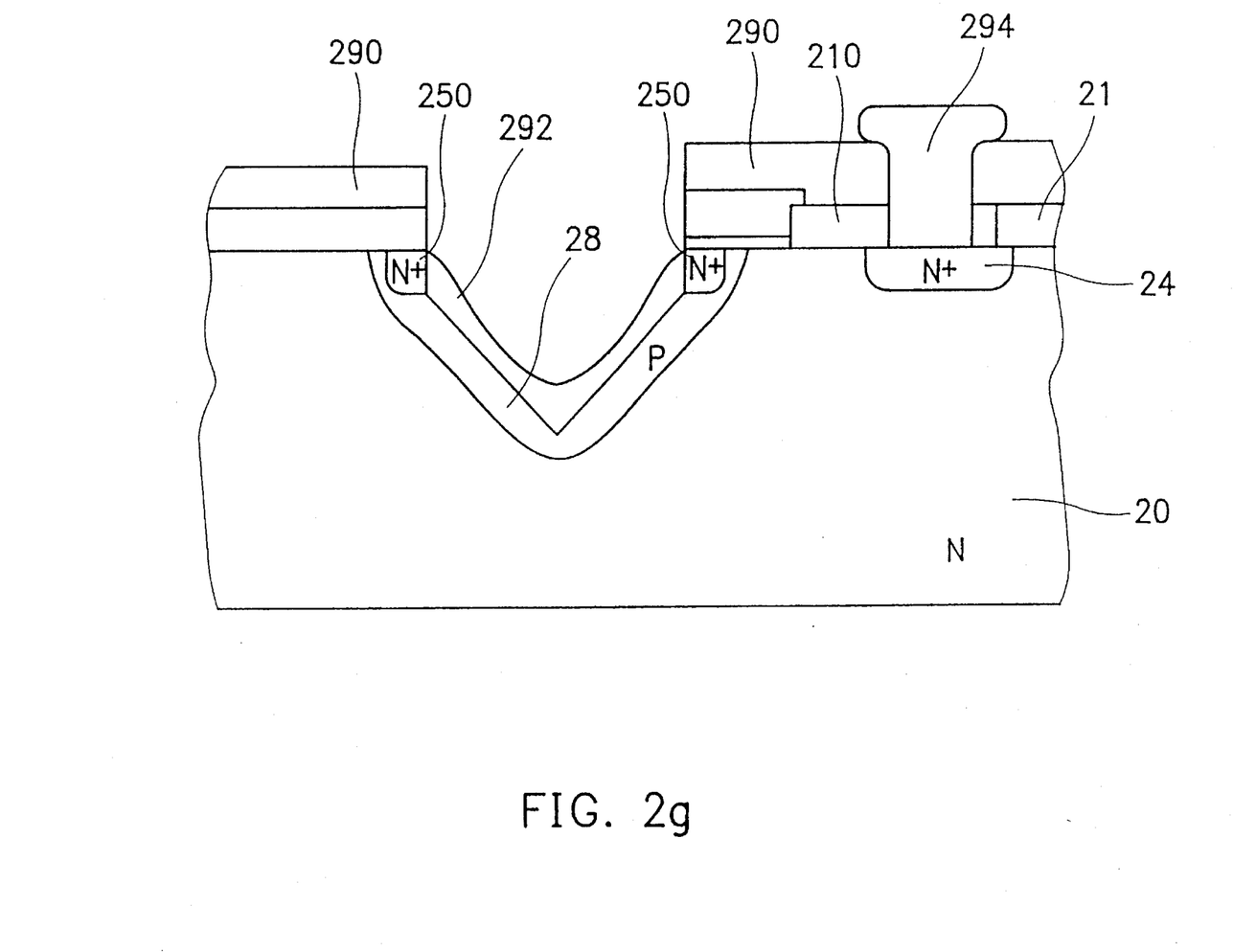
Figure 3A:
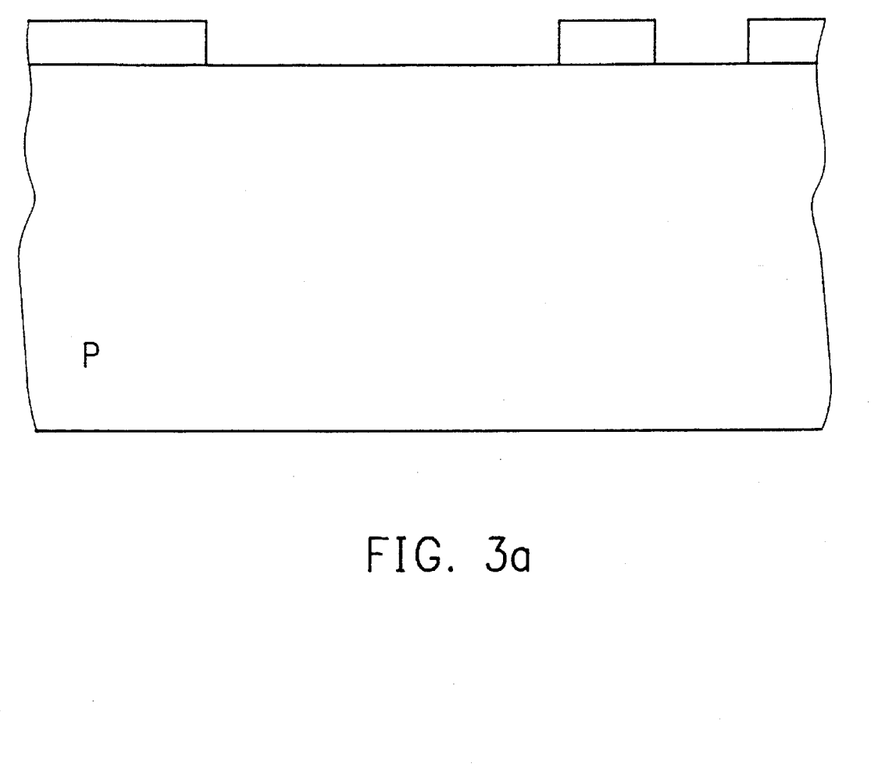
FIGS. 3a to 3g show another embodiment of producing an LDMOS transistor according to the method of the present invention.
Figure 3B:
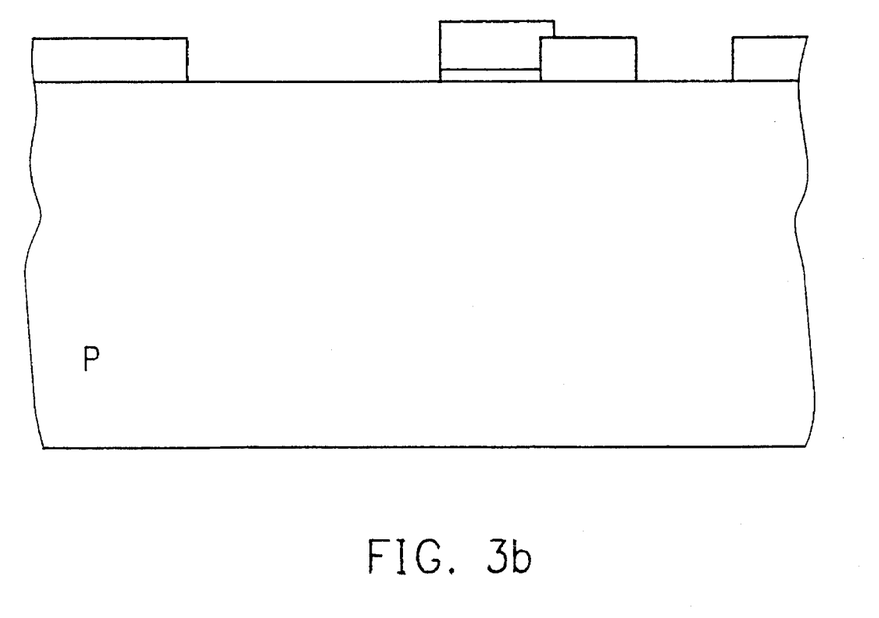
Figure 3C:
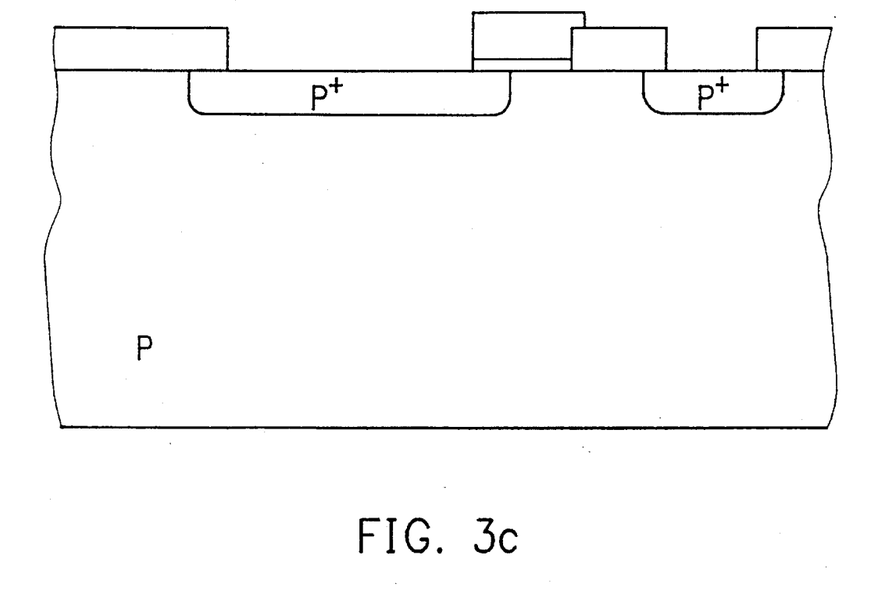
Figure 3D:
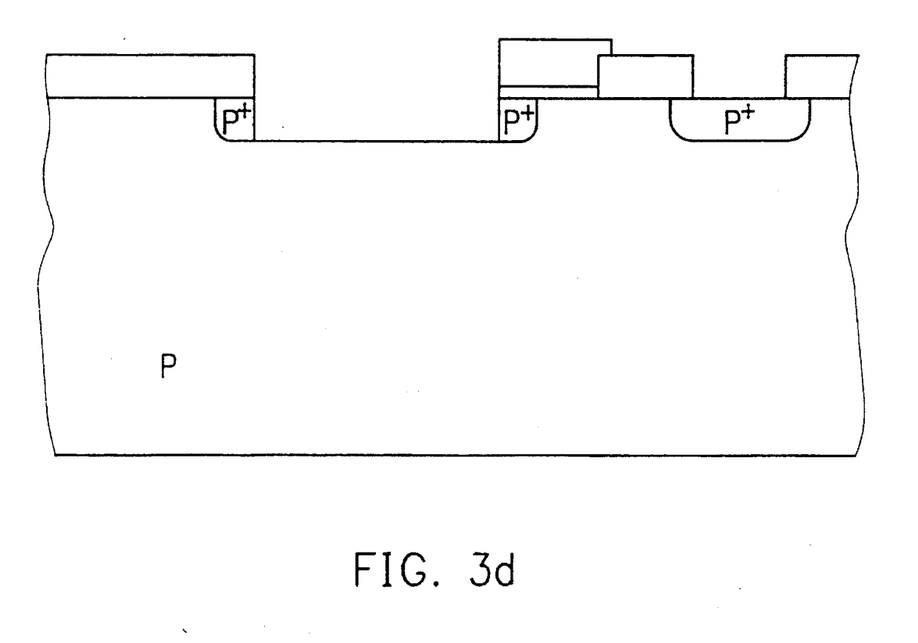
Figure 3E:
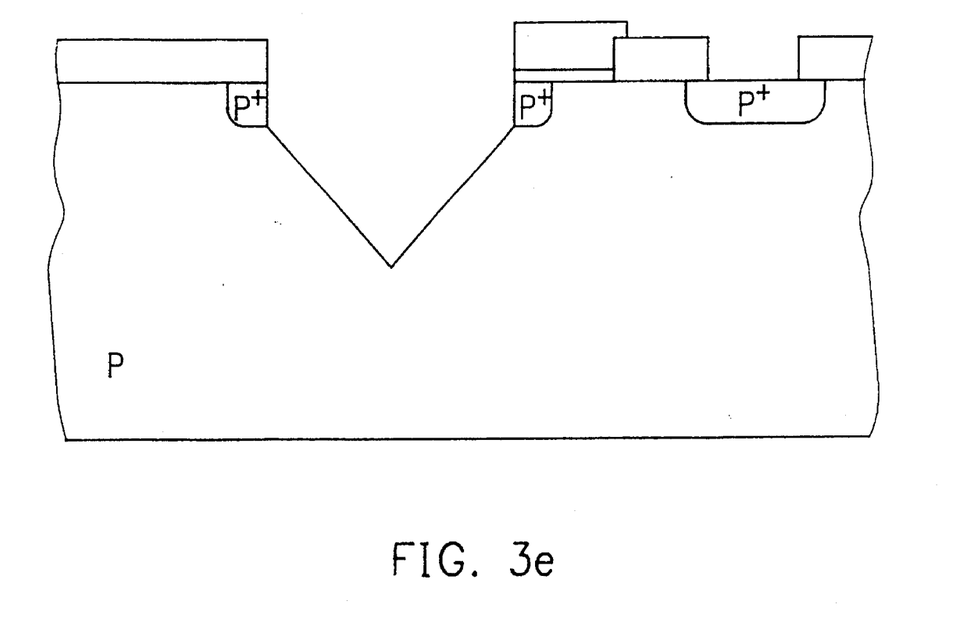
Figure 3F:
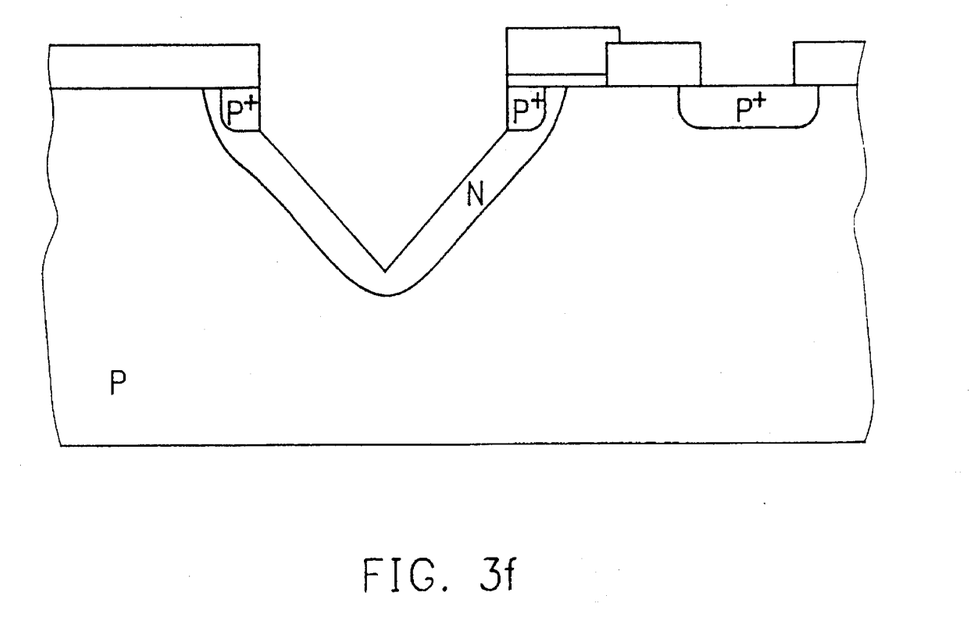
Figure 3G:
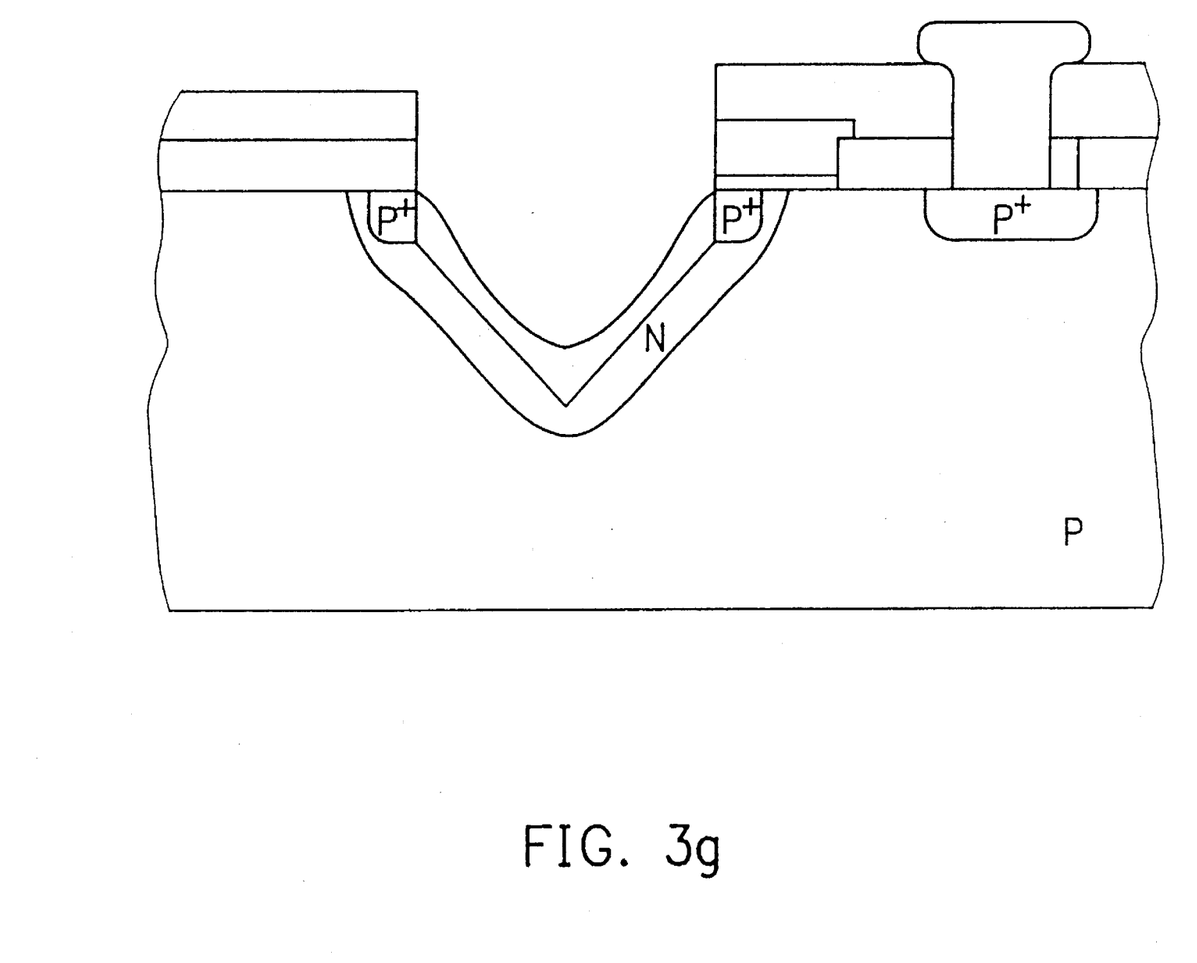

Turning to FIG. 2g, a silicon dioxide layer 290 is formed on the substrate 20 using CVD techniques which is followed by depositing a metal layer (not shown) on the SiO layer. The metal layer is patterned using conventional photolithographic techniques and etched to define a source electrode metal contact 292 and a drain electrode metal contact 294.

Since the first-mentioned trench 26 (FIG. 2d) is etched to a depth which reaches the N type substrate 20, the vertically projected area of the residual portions of the second N+ region 25, i.e. the N+ source region 250, is relatively small (i.e. smaller than the projected area in the prior art). The vertically projected area is the area which source region 250 projects on a plane parallel to the major surface of the substrate 20. In the present invention, the leakage caused by the parasitic NPN transistor and the propensity of the transistor to latch-up are reduced compared to that of the prior art.

Another preferred embodiment of the present invention is shown in FIGS. 3a to 3g to form an LDMOS transistor on a P type substrate or a P type epitaxial layer. Since the processes are essentially the same as in the above described embodiment and will be readily apparent to those skilled in the art, this embodiment need not be described in detail.

While the invention has been described by way of examples and in terms of two preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A semiconductor device comprising:

(a) a semiconductor substrate of a first conductivity type;

an insulating material disposed over said substrate to define an active region, a first predetermined location of said active region implanted with impurities of the first conductivity type to form a drain region;

(c) a gate electrode disposed at a second predetermined location of the active region;

(d) a trench therein adjacent said gate electrode, said trench having:

(i) first sidewalls which intersect said substrate essentially normal to a major surface thereof and extend in a direction normal to said major surface for a predetermined distance, and (ii) second sidewalls then converging towards each other as the depth of the trench in said substrate increases;

(e) a first residual region of the substrate, said first residual region being implanted with impurities of the first conductivity type and being disposed immediately adjacent one of the first sidewalls, below and under said gate electrode, without being immediately adjacent said second sidewalls, said first residual region forming a source region; and (f) a body region implanted with impurities of a second conductivity type material surrounding said trench and said source region.

2. The semiconductor device of claim 1, wherein a second residual region of the substrate is implanted with impurities of the first conductivity type and is disposed under the insulating material and spaced from the first residual region on an opposite side of said one of the first sidewalls of said trench.

3. The semiconductor device of claim 1, wherein a portion of said trench having said second sidewalls is essentially v-shaped.

* * * * *